United States Patent
Francis et al.

(10) Patent No.: US 6,919,248 B2
(45) Date of Patent: Jul. 19, 2005

(54) ANGLED IMPLANT FOR SHORTER TRENCH EMITTER

(75) Inventors: Richard Francis, Manhattan Beach, CA (US); Chiu Ng, El Segundo, CA (US)

(73) Assignee: International Rectifier Corporation, El Segundo, CA (US)

(*) Notice: Subject to any disclaimer, the term of this patent is extended or adjusted under 35 U.S.C. 154(b) by 82 days.

(21) Appl. No.: 10/389,857

(22) Filed: Mar. 14, 2003

(65) Prior Publication Data

US 2004/0178457 A1 Sep. 16, 2004

(51) Int. Cl.[7] .................. H01L 21/336; H01L 21/425
(52) U.S. Cl. .................. 438/270; 438/524; 438/589
(58) Field of Search .................. 438/259, 270, 438/272, 524, 589

(56) References Cited

U.S. PATENT DOCUMENTS 6,118,150 A * 9/2000 Takahashi .................. 257/341
6,274,437 B1 * 8/2001 Evans .................. 438/272
6,583,010 B2 * 6/2003 Mo .................. 438/270

* cited by examiner

Primary Examiner—Amir Zarabian
Assistant Examiner—Pamela E Perkins
(74) Attorney, Agent, or Firm—Ostrolenk, Faber, Gerb & Soffen, LLP

(57) ABSTRACT

An insulated gate trench type semiconductor device having L-shaped diffused regions, each diffused region having a vertically oriented portion and a horizontally oriented portion extending laterally from the vertically oriented portion, and a method for manufacturing the device in which the vertically oriented portion of each L-shaped diffused region is formed by directing dopants at an angle toward a sidewall of a trench to form the vertically oriented portion using the edge of the opposing sidewall of the trench as a mask.

8 Claims, 8 Drawing Sheets

ANGLED IMPLANT FOR SHORTER TRENCH EMITTER

BACKGROUND OF THE INVENTION

The present invention relates to insulated gate switching devices and more particularly to an insulated gate trench type switching device and a method for the manufacture thereof.

Trench type insulated gate semiconductor devices such as trench type MOSFETs and IGBTs are well known. Typically, a trench type insulated gate semiconductor device includes trenches formed in a semiconductive body, which are lined with a gate insulation layer, such as silicon dioxide, and filled with a conductive gate material such as polysilicon to form a gate structure. The semiconductive body typically includes a first region of a first conductivity type (base region) which extends from a first major surface of the semiconductive body to a predetermined depth. The base region is typically disposed over a second region of a second conductivity type (drift region). The trenches extend from the first major surface of the semiconductive body into the drift region.

In a trench type insulated gate semiconductor device according to a known design, diffused regions of a second conductivity type (conventionally designated as source regions in MOSFETs and as emitters in IGBTs), which extend from the first major surface of the semiconductive body to a predetermined depth, are formed adjacent the sidewalls of the trenches by, for example, an implantation step at a vertical angle to the top surface of the semiconductive body through a mask followed by a diffusion drive. As is well known the diffusion drive step will cause the implanted dopants to travel vertically downward into the semiconductive body and travel in a lateral direction in relation to the sidewalls of the trenches simultaneously.

The diffused regions so formed extend to a depth that is less than the thickness of the base region. Therefore, the diffused regions are spaced from the drift region. As a result a region exists in the base region of the semiconductive body conventionally known as the channel region which is disposed between each diffused region and the drift region and adjacent a sidewall of a trench. It is well known that each channel region may be inverted by application of voltage to the conductive material in the trench adjacent thereto thereby allowing current to flow between the diffused region and the drift region.

The length of the channel region is an important variable as it may control such important design factors as the capability of the device to respond to a high switching frequency. To obtain a shorter channel region in a conventional trench type insulated gate semiconductor device, which may result in having a device that is capable of handling higher switching frequencies, the diffused regions may be driven deeper, thereby shortening the channel region. Such a step, however, requires longer diffusion time at higher temperatures both of which are time consuming and thus increase the manufacturing costs. Additionally, longer diffusion time causes extensive lateral diffusion thus increasing the lateral width of the diffused regions. As a result the lateral area that is covered by the diffused regions increases, which in turn results in lower cell density. In addition, the larger lateral width of each diffused region increases the length of the path that is traveled by leakage or other currents under the diffused regions, thereby adversely affecting the ability of the device to withstand avalanche.

It is, therefore, desirable to have a method for manufacturing a device which may allow for obtaining shorter channel regions and higher cell densities at a reduced cost.

SUMMARY OF THE INVENTION

It is an object of the present invention to provide an insulated gate trench type semiconductor device.

It is also an object of the present invention to provide a method for manufacturing an insulated gate trench type semiconductor device which allows for adjusting the length of the channel regions of the device and adjusting of the cell density of the device.

An insulated gate trench type semiconductor device according to the present invention includes a plurality of trenches lined with an insulation layer and filled with a conductive material, and a plurality of L-shaped diffused regions formed adjacent the sidewalls of the trenches. According to one aspect of the present invention, each L-shaped diffused region includes a vertically oriented portion which extends from an edge of a sidewall of a trench to a predetermined depth into the base region of the semiconductive body, and a horizontally oriented portion which extends laterally away form the end of the vertically oriented portion.

The vertically oriented portion of each diffused region in a device according to the present invention is formed by directing dopants at an angle other than a ninety degree angle toward a sidewall of a trench at a sufficient energy to implant the same in the sidewall using the edge of the opposing sidewall as a mask. By adjusting the angular direction of the dopants the depth of the vertically oriented portion of each diffused region may be adjusted which in turn can be used to adjust the length of the channel region.

The horizontally oriented portion of each diffused region of an insulated gate trench type semiconductor device according to the present invention is formed by implanting a layer of dopants adjacent the vertically oriented portion of the diffused region. Thus, by implanting the vertically oriented portion of each diffused region using an edge of a sidewall as a mask the depth of the diffused region may be controlled independent of the lateral width of the diffused region thereby allowing the length of the channel region to be controlled without adverse effects on cell density. In addition, the lateral width of the diffused regions may be controlled, thereby allowing the designer to control the capability of the device to withstand avalanche.

Other features and advantages of the present invention will become apparent from the following description of the invention which refers to the accompanying drawings.

DETAILED DESCRIPTION OF THE FIGURES

Figure 1:
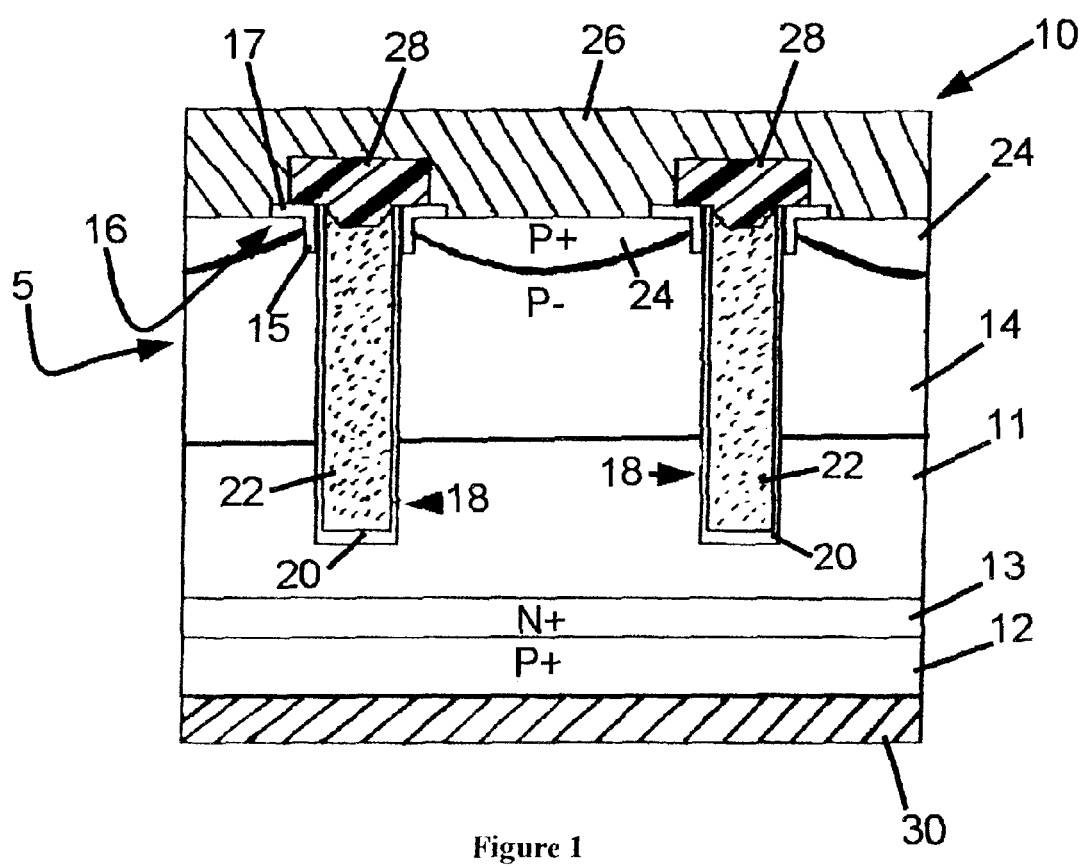
FIG. 1 shows a cross-sectional view of a semiconductor device according to the present invention.

FIG. 1 shows a representative cross-sectional view of the active area of semiconductor device 10 according to the present invention. Semiconductor device 10 shown in FIG. 1 is an IGBT. One skilled in the art, however, would recognize that the process of the present invention may also be used in the manufacturing of other switching semiconductor devices such as MOSFETs.

Referring to FIG. 1, semiconductor device 10 comprises semiconductive body 5. Semiconductive body 5 includes first region 14 of a first conductivity type (base region) which is disposed over second region 11 of a second conductivity type (drift region), and diffused regions 16 (emitter regions). Emitter regions 16 are formed in base region 14 adjacent to opposing walls of trenches 18, which extend from the top surface of semiconductive body 5 to a depth that is below the depth of base region 14. Each trench 18 is lined with a thin gate insulation layer 20, for example, a silicon dioxide layer, and filled with a conductive gate material 22, such as, polysilicon, to form a gate structure.

In semiconductor device 10, emitter regions 16 are doped with dopants of a second conductivity type opposite to the first conductivity type. Semiconductor device 10 also includes high conductivity regions 24 of the first conductivity type which extend to a predetermined depth into base region 14. Semiconductor device 10 includes emitter contact 26, which is in electrical contact with high conductivity regions 24 and emitter regions 16, and collector contact 30. Collector contact 30 is in direct electrical contact with conductivity modulating region 12, which is of the first conductivity type. Buffer region 13, which is of the same conductivity type as, but higher concentration than the drift region 11 is disposed between drift region 11 and conductivity modulating region 30. Conductivity modulating region 12 injects carriers into the drift region which results in improving the overall conductivity of the device during operation. Buffer region 13 improves the turn-off speed of the device by reducing the injection rate of the carriers into the drift region and increasing the recombination rate during a switching cycle.

Conductive gate material 22 in each trench 18 is electrically isolated from emitter contact 26 by a respective insulation plug 28. Conductive gate material 22 in each trench is electrically connected to a gate contact (not shown) such that the application of an appropriate bias to the gate contact will cause inversion in those portions of base region 14 adjacent to trenches 18 (channel regions) to enable conduction between emitter contact 26 and collector contact 30 as is well known in the art.

Semiconductive body 5 in the embodiment shown by FIG. 1 may be comprised of an epitaxially grown semiconductive layer which is formed over a top surface of a float zone monocrystalline semiconductive substrate. Preferably, conductivity modulating region 12 and buffer region 13 are formed in the float zone monocrystalline semiconductive portion of semiconductive body 5, while the remaining features of semiconductor device 10 are formed in the epitaxially grown semiconductive layer. Alternatively, semiconductive body 5 may be comprised entirely of float zone monocrystalline semiconductive material such as monocrystalline silicon.

Each emitter region 16 in semiconductor device 10 includes vertically oriented portion 15, which extends vertically into base region 14, and horizontally oriented portion 17 which extends laterally away from the top edge of vertically oriented portion 15, thereby forming an upside down L-shaped structure.

The upside down L-shaped structure of emitter regions 16 is advantageous in that the length of vertically oriented portion 15 of an emitter region 16 can be adjusted to achieve the desired length of the channel region; while the length of horizontally oriented portion 17 of an emitter region 16 can be adjusted as desired to obtain the desired cell density. Also, the width of the vertically oriented portion 15 can be controlled thus allowing the designer to control the ability of the device to withstand avalanche. In a device according to the prior art, to achieve a shorter channel region, the emitter region must be driven for a longer period of time. Such a process is time consuming and expensive. In addition, in a drive step to shorten the channel region the lateral width of the emitter region is also increased thereby reducing the cell density that may be achieved, and adversely affecting the ability of the device to withstand avalanche. Thus, having an L-shaped emitter region provides the designer with the flexibility to adjust the vertical depth of the emitter region independent of its lateral width which allows the length of the channel region to be adjusted without affecting the cell density.

Figure 2:
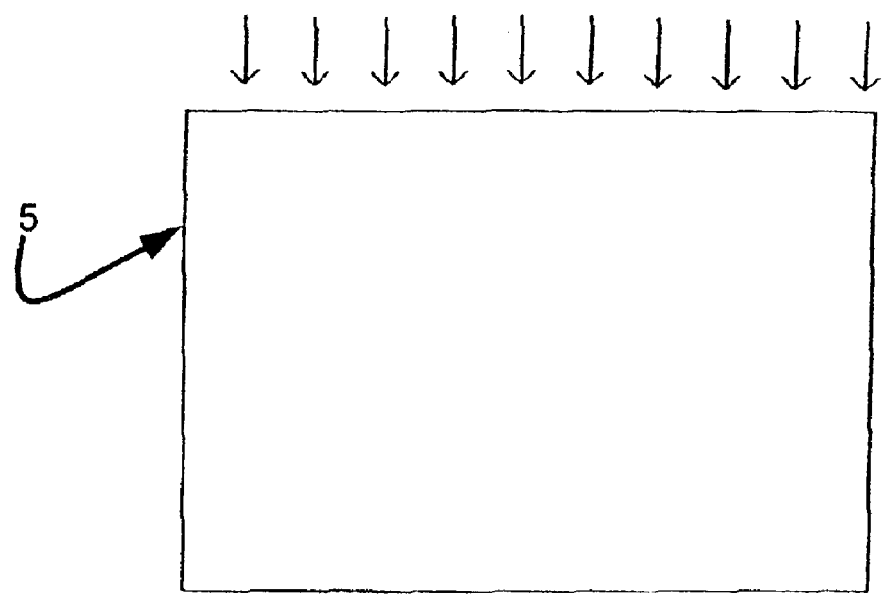
FIGS. 2–15 show the various structures obtained during the processing that is employed to obtain the device of FIG. 1.
Figure 3:
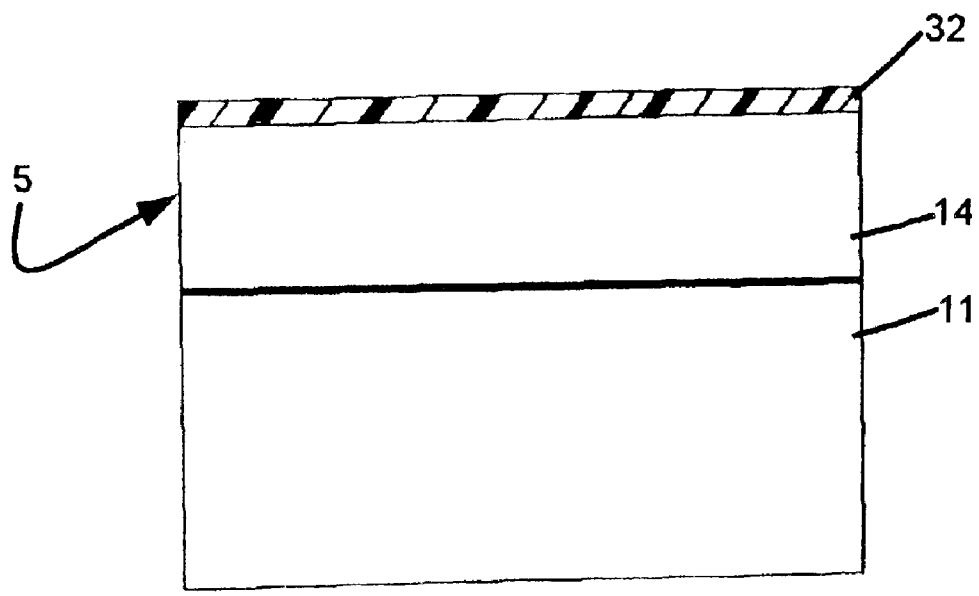
Figure 4:
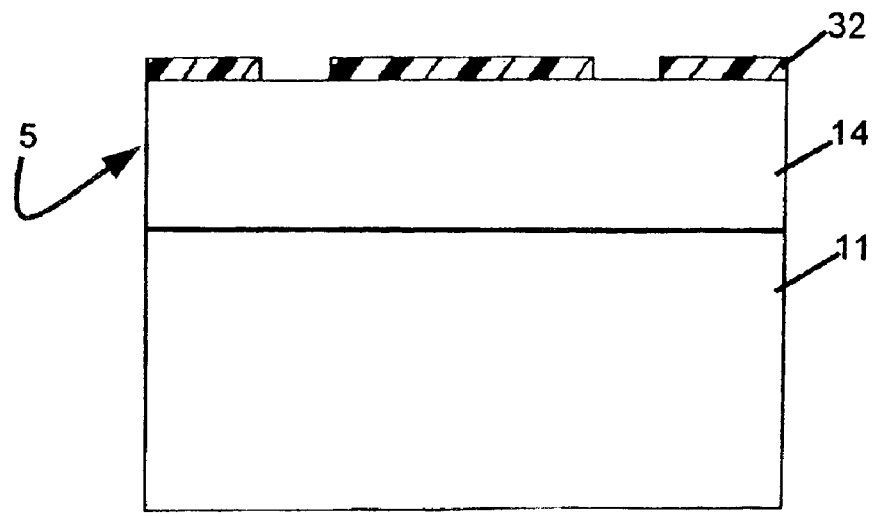
Figure 5:
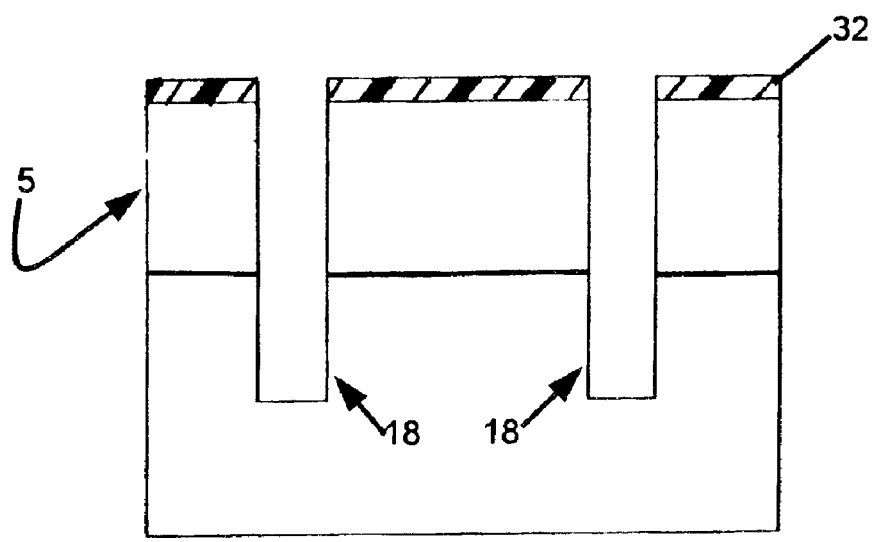

Referring to FIG. 2, semiconductor device 10 (FIG. 1) is manufactured according to the following process. Initially, the top surface of semiconductive body 5 is oxidized. The oxide layer is then etched to open an area over the top surface of semiconductive body 5. Next, dopants of a first conductivity type such as boron, are implanted through the opening provided in the oxide layer. The dopants are then driven in a drive step to form base region 14 as shown by FIG. 3. As a result of the drive step an oxide layer 32 is formed over the top surface of substrate 5. Using conventional photolithography, openings are formed in oxide layer 32 as shown by FIG. 4. Next, the openings in oxide layer 32 are used to etch semiconductive body in order to form trenches 18 as shown by FIG. 5.

Figure 6:
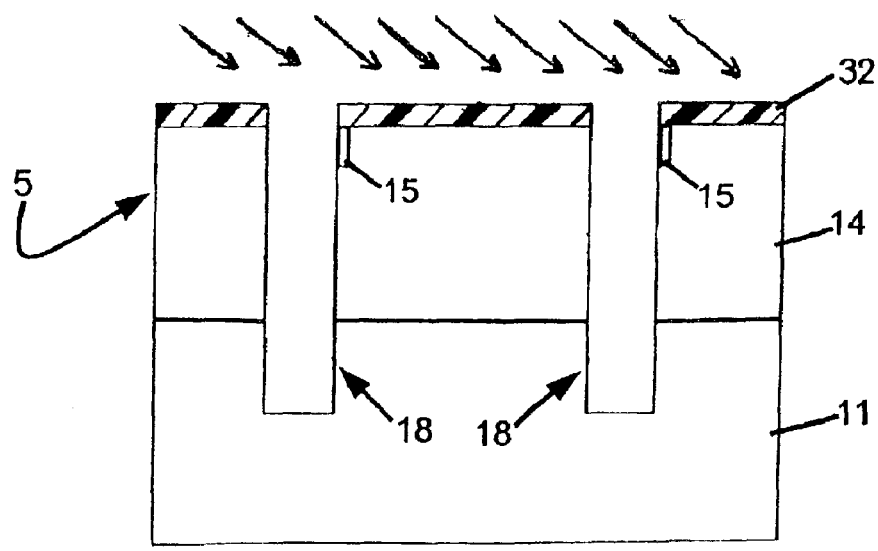

Referring next to FIG. 6, according to an aspect of the present invention, dopants of the second conductivity type are implanted into a side wall of each trench 18 using the opposing edge of each trench as a shadow mask. It should be noted that the dopants are directed at an angle other than a ninety degree angle toward the side wall of each trench 18 so that the respective opposing edge of each trench may be used as a shadow mask. Next, the opposing wall of each trench is subjected to implantation in the same manner as set forth above and illustrated in FIG. 7. By using the edge of each trench as a shadow mask and the proper angling of the implants according to the present invention the depth of emitter regions 16 and the length of the channel regions can be controlled effectively. As a result, vertically oriented portion 15 of emitter regions 16 are formed.

Figure 7:
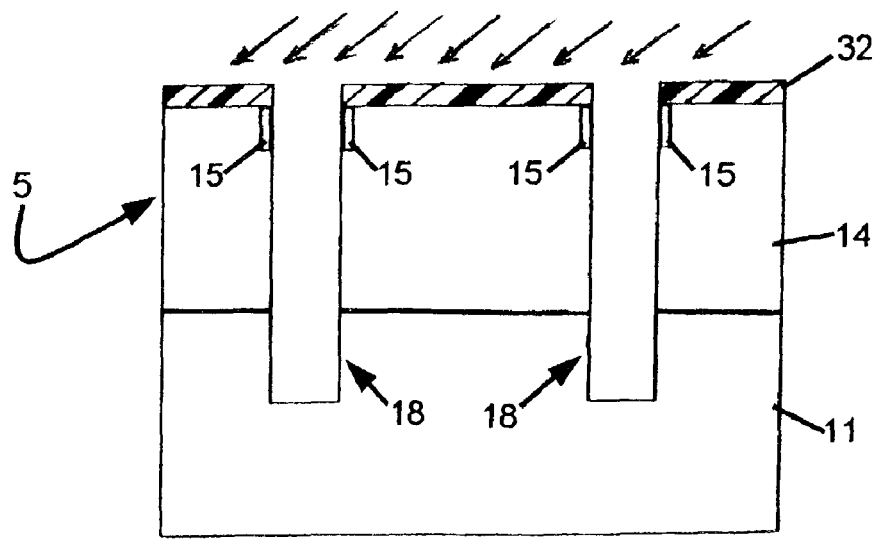
Figure 8:
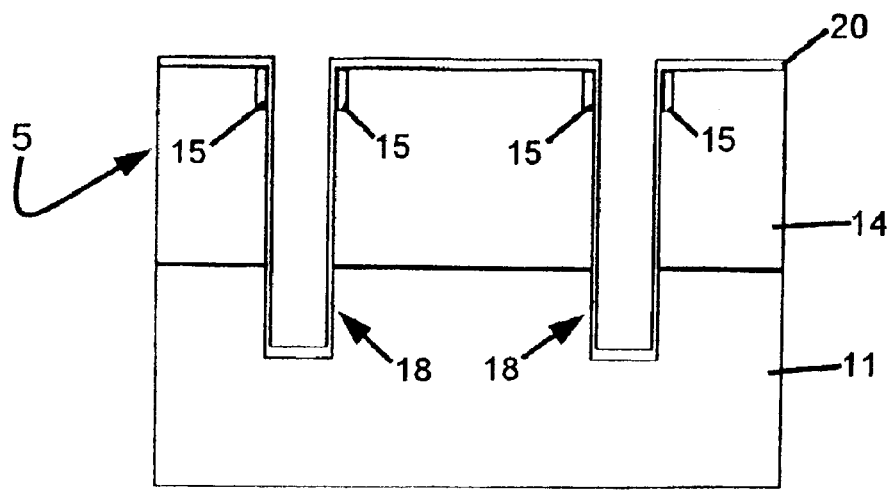

Next, the structure shown by FIG. 7 is subject to heating in order to diffuse the dopants in vertically oriented regions 15 followed by the removal of oxide layer 32 along with any photo resist left from the last photolithographic step. Thereafter, thin gate insulation layer 20 is grown on the side walls and bottom of each trench 18. The resulting structure is shown by FIG. 8. Trenches 18 are then filled with conductive gate material 22 which results in the structure shown by FIG. 9.

Figure 9:
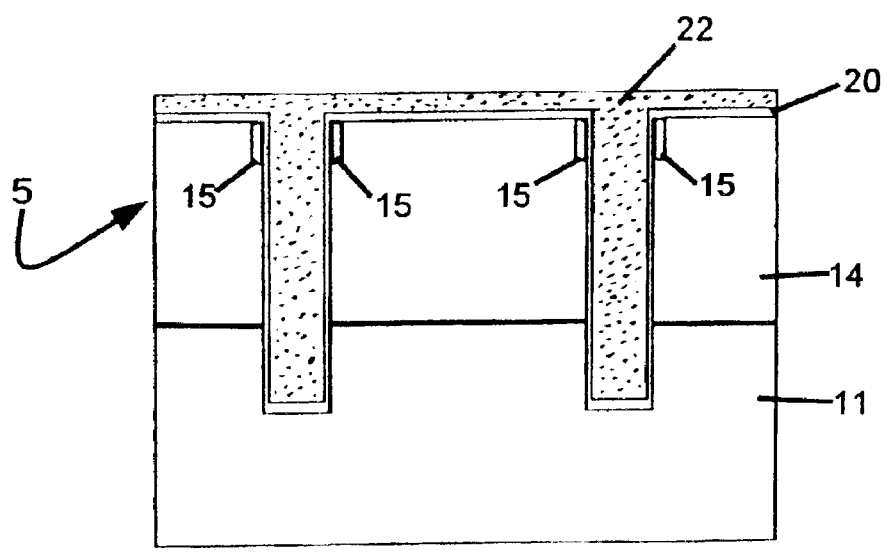
Figure 10:
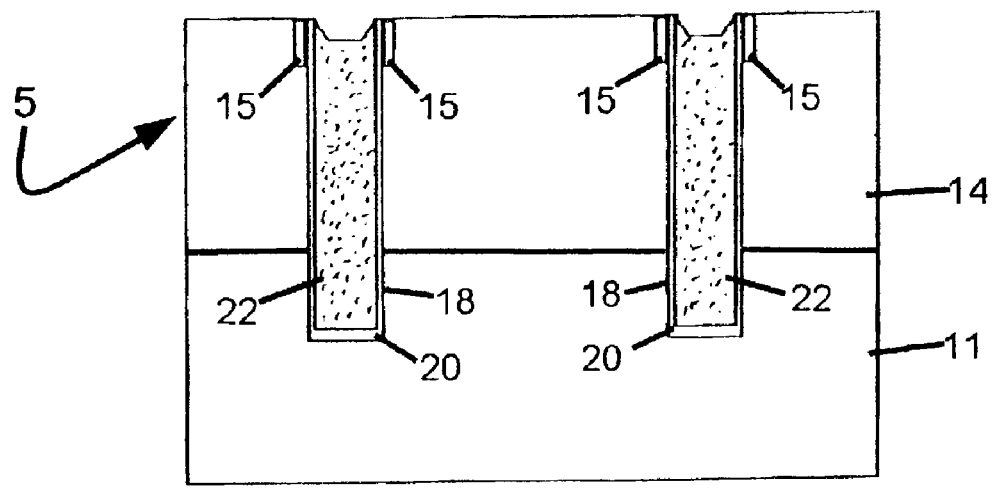

As seen in FIG. 9, conductive material 22 extends beyond the top of each trench 18 and over the top surface of semiconductive body 5. This excess amount of conductive material 22 is removed from the top surface of semiconductive body 5 by, for example, etching to obtain the structure shown in FIG. 10.

Figure 11:
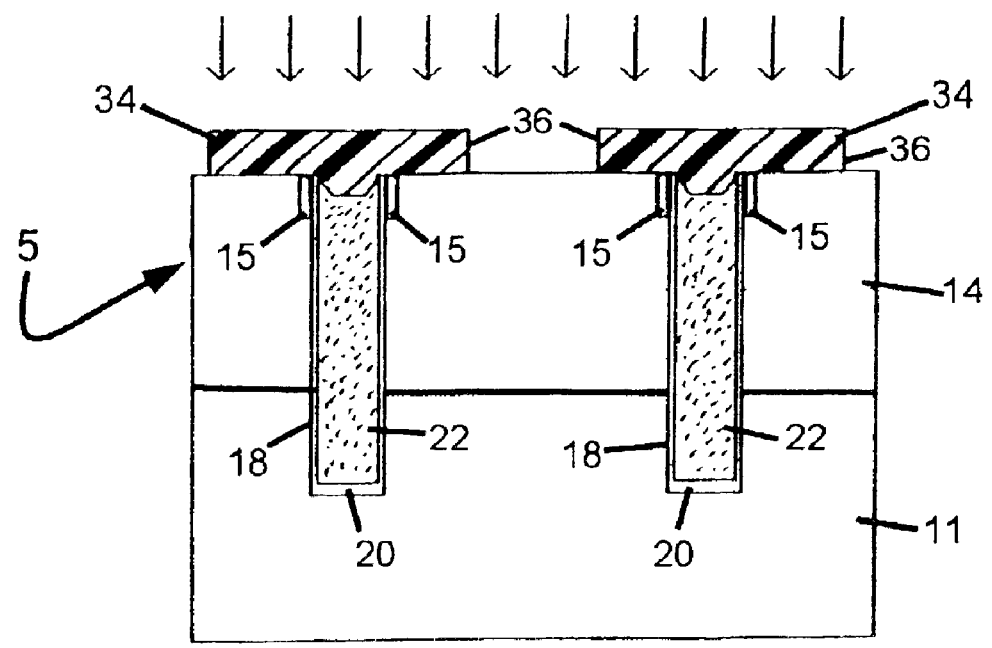
Figure 12:
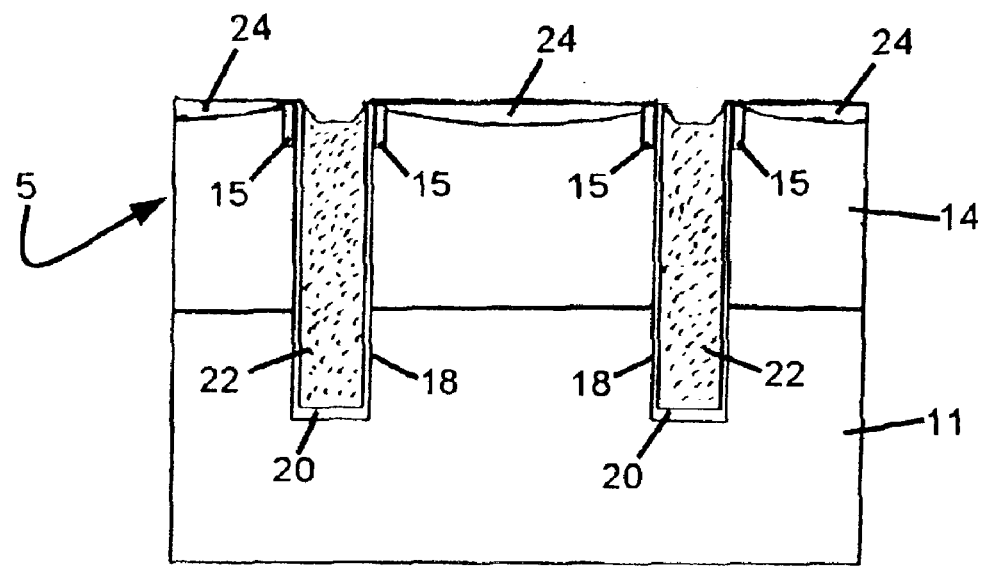

Thereafter, mask 34 is formed over the top surface of semiconductive body 5 by, for example, photolithography or any other known method. Mask 34 includes openings 36 over the top surface of semiconductive body 5 between the trenches as shown by FIG. 11. Dopants of the first conductivity type are then implanted into base region 14 through openings 36 in mask 34. Mask 34 is then removed and the dopants which were implanted through openings 36 are driven to form high conductivity regions 24 as shown by FIG. 12.

Figure 13:
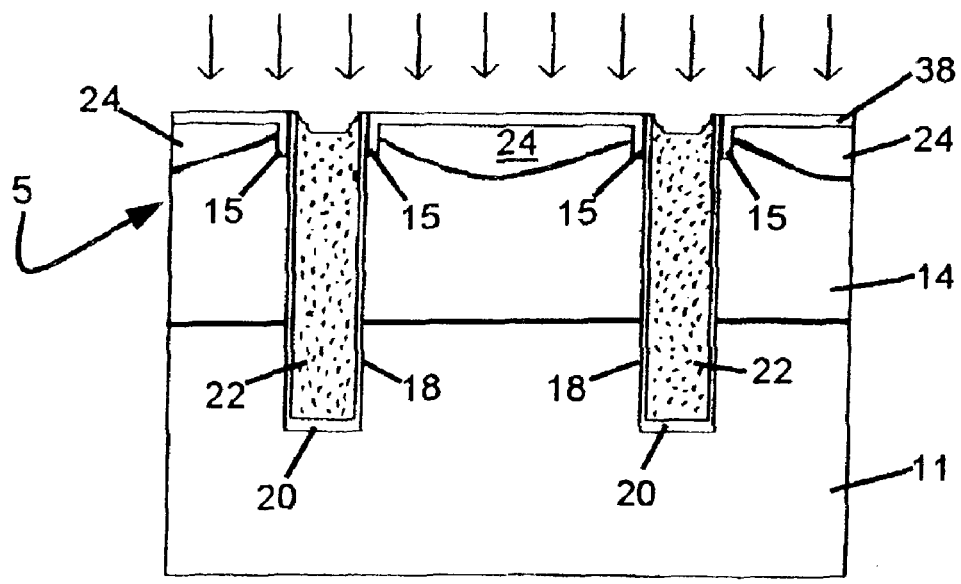
Figure 14:
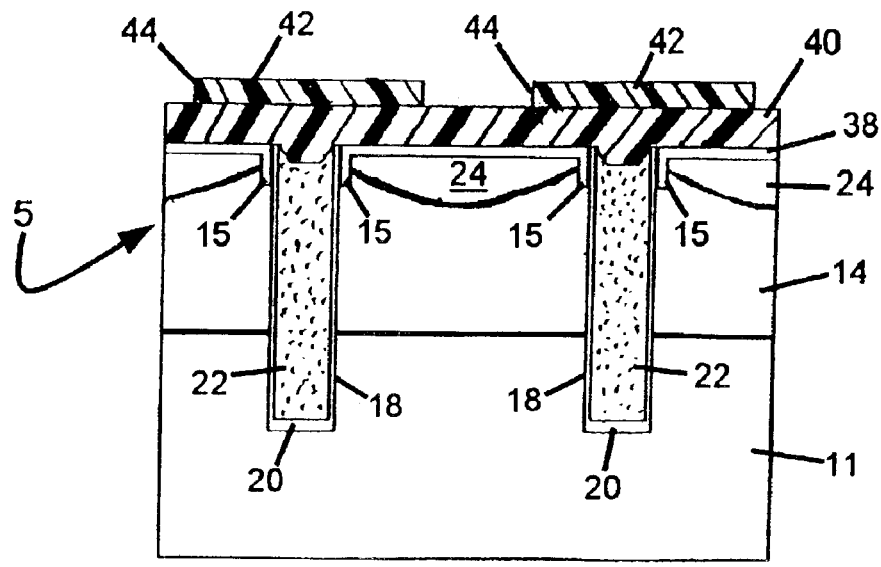

Next, dopants of the second conductivity type, such as Arsenic, are implanted on the top surface of semiconductive body 5 to form layer 38 as shown schematically by FIG. 13. The implants in layer 38 are then driven in a drive step to a desired depth and a low temperature oxide (LTO) layer 40 is deposited over the top surface of the semiconductive body 5 to obtain the structure shown by FIG. 14. Contact mask 42 is then formed over LTO layer 40 using photolithography. Contact mask 42 includes openings 44. The LTO and portions of layer 38 below openings 44 are then removed by, for example, etching to obtain the structure shown by FIG. 15. It should be noted that LTO layer 40 and layer 38 are etched until at least the top of high conductivity regions 24 is exposed, which results in the formation of horizontally oriented portions 17 of emitter regions 16, and insulation plugs 28. Also, it should be noted that LTO layer 40 remaining over the top surface of layer 38 is etched back to expose portions of the top surface of horizontally oriented portions 17. This result can be accomplished by, for example, anisotropic etching to vertically etch through LTO layer 40 and layer 38 until high conductivity regions 24 is reached, and then selective wet etching of a desired portions of LTO layer 40 to expose portions of the top surface of horizontally oriented portions 17.

Figure 15:
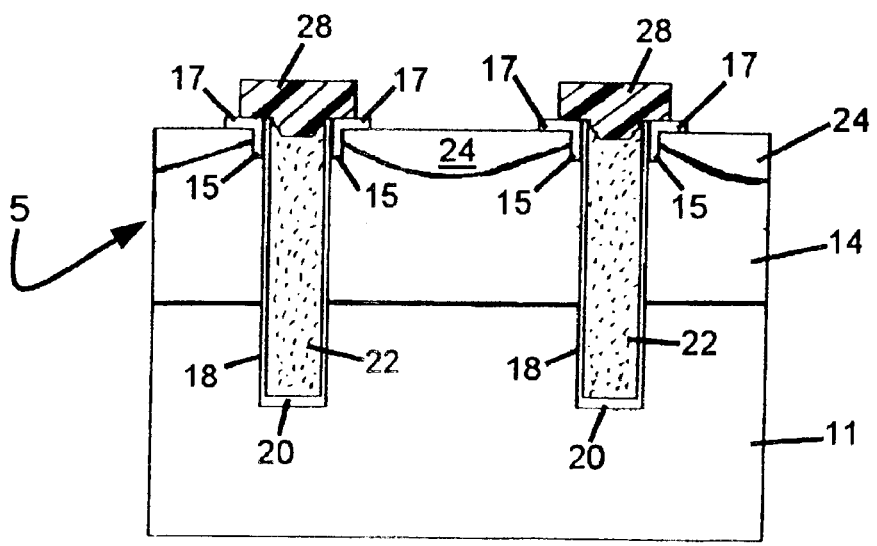

Next, emitter contact 26 is sputtered over the top surface of the structure shown by FIG. 15. Emitter contact 26 may be comprised of aluminum or some other suitable metal. The top surface of the structure is then further processed to provide a gate contact (not shown). The back side of semiconductive body 5 may be further implanted with dopants to form buffer region 13, and conductivity modulating region 12. Optionally, semiconductive body 5 may be then thinned from the back before forming buffer region 13 and conductivity modulating region 12. Lastly, collector contact 30 is sputtered onto the backside of semiconductive body 5 to obtain the device shown by FIG. 1.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for manufacturing a semiconductor device comprising:

forming trenches through a channel region of one conductivity type in a semiconductor body having a first major surface and a second major surface, said trenches having opposing sidewalls, each sidewall meeting said first major surface to form an edge;

forming a first conductive region of another conductivity in a first sidewall of at least one of said trenches by directing dopants of another conductivity toward said first sidewall of at least one of said trenches in a direction not parallel to said sidewall and at a sufficient energy to implant the same into only a portion of said first sidewall to a first lateral depth inside said channel region; and forming a second conductive region of said another conductivity oriented transverse to said first conductive region and said sidewall, said second conductive region terminating at said first major surface and extending laterally further than said first depth to a second depth within said channel region, whereby a portion of said second conductive region is disposed over said first conductive region, and another portion of said second conductive region is disposed over a region of said channel region, wherein said first conductive region and said second conductive region are formed in separate steps, whereby vertical and lateral dimensions of said first conductive region and said second conductive region can be independently controlled.

2. A process for manufacturing a semiconductor device according to claim 1, further comprising directing dopants of another conductivity type toward said opposing sidewall opposite to said first sidewall in a direction not parallel to said opposing sidewall and at a sufficient energy to implant the same into portions of said opposing sidewall to form a third conductive region of said another conductivity opposite said first conductive region.

3. A process for manufacturing a semiconductor device according to claim 2, further comprising lining said at least one trench with an insulation layer.

4. A process for manufacturing a semiconductor device according to claim 3, further comprising filling said at least one trench with a conductive material.

5. A process for manufacturing a semiconductor device according to claim 1, further comprising implanting dopants of said one conductivity type into said channel region from said first major surface to form high conductivity regions in between said trenches.

6. A process for manufacturing a semiconductor device according to claim 1, wherein said second conductive region is formed by implanting dopants of another conductivity type over said first major surface of said semiconductive body.

7. A process for manufacturing a semiconductor device according to claim 6, further comprising forming recesses in said first major surface between said trenches, each recess being deep enough to reach a high conductivity region below said second conductive region.

8. A process for manufacturing a semiconductor device according to claim 7, further comprising forming a contact over said first major surface to make electrical contact with said at least second conductive region.

* * * * *